United States Patent
Lin et al.

(10) Patent No.: US 6,794,253 B2
(45) Date of Patent: Sep. 21, 2004

(54) MASK ROM STRUCTURE AND METHOD OF FABRICATING THE SAME

(75) Inventors: Shang-Ping Lin, Yiilan Hsien (TW); Tsung-Yi Chou, Hsinchu (TW); Chun-Yi Yang, Hsinchu County (TW); Hsiang-Pang Lee, Taoyuan (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/248,832

(22) Filed: Feb. 24, 2003

(65) Prior Publication Data

US 2004/0166639 A1 Aug. 26, 2004

(51) Int. Cl.⁷ .......................................... H01L 21/8236

(52) U.S. Cl. ........................................ 438/276

(58) Field of Search ................... 438/276, 275, 438/277

(56) References Cited

U.S. PATENT DOCUMENTS 5,580,809 A * 12/1996 Mori et al. .................. 438/275
6,190,974 B1 * 2/2001 Wang ........................ 438/276

* cited by examiner

Primary Examiner—David Nelms
Assistant Examiner—Quoc Hoang
(74) Attorney, Agent, or Firm—Jianq Chyun IP Offfice

(57) ABSTRACT

A method of fabricating a mask ROM is provided, gate dielectric and a plurality of first conductive strips are sequentially formed over a substrate. A first dielectric layer is formed over the substrate and the first conductive strips. The first dielectric layer is patterned to form a plurality of first coding openings. Each first coding opening exposes the first conductive layer. A plurality of first wells is formed in the first conductive layer at the bottom of the first coding openings. A plurality of second conductive strips is formed over the first dielectric layer and inside the first coding openings to connect electrically with corresponding first wells and form a diode memory cell array. Additional diode memory cell arrays may stack over the diode memory cell array to increase device integration.

25 Claims, 4 Drawing Sheets

MASK ROM STRUCTURE AND METHOD OF FABRICATING THE SAME

BACKGROUND OF INVENTION

1. Field of Invention

The present invention relates to a method of fabricating read-only-memory (ROM). More particularly, the present invention relates to a method of fabricating a mask read-only-memory (ROM).

2. Description of Related Art

Read-only-memory (ROM) is a type of non-volatile memory whose data is retained even when power is turned off. Due to such versatility, ROM is an indispensable device for booting up many electronic products before conducting any normal operations. One of the most common types of ROM is the mask ROM. Typically, a mask ROM uses a conductive transistor to serve as a memory cell. To program the mask ROM, ions are selectively implanted into specified channel regions so that the threshold voltages of these transistors are adjusted. Memory data is stored inside these memory cells according to whether the respective channel regions of these cells are on or off.

In general, the memory cell array of a mask ROM is fabricated with a particular transistor configuration. The mask ROM constructed from an array of transistors can have the following problems.

Due to the demand for a high-quality silicon substrate and gate oxide layer underneath the transistors, conditions for fabricating the transistor array must be strictly adhered to. Stacking an additional layer over such an array of transistor is difficult.

Furthermore, in the presence of leakage current, a memory cell array fabricated from transistors, the window for decoding a "1" or "0" data is not very clear. In other words, decoding errors may occur.

In addition, the bit lines of a transistor memory cell array are fabricated by implanting dopants into the substrate. However, as devices continue to be miniaturized, junction depth will be shallower leading to rise in bit line resistance. Ultimately, operating efficiency of the device may be affected.

SUMMARY OF INVENTION

Accordingly, one object of the present invention is to provide a mask read-only-memory (mask ROM) structure and method of fabricating the same that reduces device dimension and increases device integration.

A second object of this invention is to provide a mask ROM structure and method of fabricating the same that provides a clearer decoding capacity and hence increases the decoding window.

A third object of this invention is to provide a mask ROM structure and method of fabricating the same that increases the operating speed of the device.

A fourth object of this invention is to provide a mask ROM structure and method of fabricating the same that simplifies the mask ROM fabrication process.

To achieve these and other advantages and in accordance with the purpose of the invention, as embodied and broadly described herein, the invention provides a method of fabricating a mask ROM. First, a substrate is provided. Thereafter, gate dielectric and a plurality of first conductive strips are sequentially formed over the substrate. A first dielectric layer is formed over the substrate and the first conductive strips. The first dielectric layer is patterned to form a plurality of first coding openings. Each first coding opening exposes the first conductive layer. A plurality of first wells is formed in the first conductive layer at the bottom of the first coding openings. A plurality of second conductive strips is formed over the first dielectric layer and inside the first coding openings to connect electrically with the first wells and form a first memory cell array.

In the aforementioned method, a second dielectric layer may form over the first dielectric layer and the second conductive strips after forming the first memory cell array. Thereafter, a plurality of third conductive strips is formed over the second dielectric layer. A third dielectric layer is formed over the second dielectric layer and the third conductive strips. The third dielectric layer is patterned to form a plurality of second coding openings. Each second coding opening exposes the third conductive layer. A plurality of second wells is formed in the third conductive strip at the bottom of the second coding openings. A plurality of fourth conductive strips is formed over the third dielectric layer and inside the second coding openings to connect electrically with the second wells and form a second memory cell array.

This invention also provides a mask read-only-memory (mask ROM) structure. The mask ROM has at least a substrate, a plurality of gate dielectric strips, a plurality of first conductive strips, a first dielectric layer, a plurality of first wells and a plurality of second conductive strips. The gate dielectric layers are positioned over the substrate. The first conductive strips are positioned over the gate dielectric layers. The first dielectric layer is positioned over the substrate and the first conductive strips. The first dielectric layer has a plurality of first coding openings that exposes the first conductive strips. The first wells are located in the first conductive strips at the bottom of first code openings. The second conductive strips are positioned over the first dielectric layer and inside the first coding openings. The second conductive strips electrically connect with the respective first wells. The gate dielectric layers, the first conductive strips, the first dielectric layer, the first wells and the second conductive strips together form a first memory cell array.

The aforementioned mask ROM structure may further include a second dielectric layer, a plurality of third conductive strips, a third dielectric layer, a plurality of second wells, a plurality of fourth conductive strips. The second dielectric layer is positioned over the first dielectric layer and the second conductive strips. The third conductive strips are positioned over the second dielectric layer. The third dielectric layer is positioned over the second dielectric layer and the third conductive strips. The third dielectric layer has a plurality of second coding openings that exposes the third conductive strips. The second wells are located in the third conductive strips at the bottom of the second coding openings. The fourth conductive strips are positioned over the third dielectric layer and inside the second coding openings. The fourth conductive strips connect electrically with the respective second wells. The second dielectric layer, the third conductive strips, the third dielectric layer, the second wells and the fourth conductive strips together form a second memory cell array.

In addition, in the aforementioned mask ROM structure and method of fabricating the same, a plurality of memory cell arrays may stack on top of the second memory cell array. Furthermore, the second conductive layers and the fourth conductive layers may be fabricated using a metallic material such as aluminum, tungsten or copper with a non-metallic material such as N+ doped polysilicon.

This invention also provides a method of decoding mask read-only-memory (mask ROM). The mask ROM has at least a plurality of word lines, a plurality of wells over the word lines and a plurality of bit lines. The word lines are doped differently from the wells (P+ type). The bit lines are perpendicular to the word lines at a different height level. A portion of the junctions between the bit lines and the word lines is electrically connected to the well. The decoding method includes applying a first voltage to the bit line corresponding to a decoding location and applying a second voltage to the bit lines outside the decoding location such that the first voltage is greater than the second voltage. At the same time, a third voltage is applied to the word line corresponding to the decoding location and a fourth voltage is applied to the word lines outside the decoding location such that the fourth voltage is greater than the third voltage.

In this invention, the cells in the memory cell array of the mask ROM are diodes. Hence, the memory cell array may stack on top of each other to form a three-dimensional structure. Consequently, size of each memory cell can be reduced and the level of integration of the memory device can be increased.

Furthermore, the decoding regions (the diodes) with implant ions are regarded as a logic state "1" and those decoding regions without implanted ions are regarded as a logic state "0". Thus, determining the logic value ("1" or "0") in the memory cell is much easier compared with a conventional transistor memory cell array. In other words, the decoding window is larger.

In addition, the bit lines may be fabricated using a metallic material. Hence, compared with a bit line formed by substrate doping, the bit lines have a lower resistance and a higher operating speed.

Since there is no need to fabricate transistors, processing demands are simpler and less stringent. Ultimately, the fabrication of the mask ROM in this invention is very much simplified.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
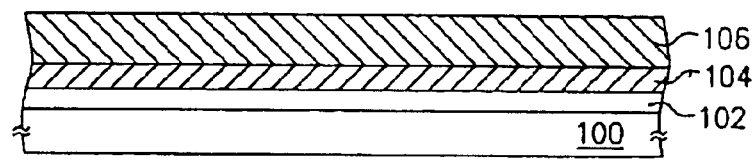
FIGS. 1A to 1F are schematic cross-sectional views showing the progression of steps for producing a mask ROM according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1F are schematic cross-sectional views showing the progression of steps for producing a mask ROM according to one preferred embodiment of this invention. As shown in FIG. 1A, a substrate 100 such as a semiconductor silicon substrate is provided. A plurality of gate dielectric strips 102 and a plurality of conductive strips 104/106 are formed over the substrate 100. The gate dielectric layer 102 is fabricated using a material such as silicon oxide and the conductive layer 104/106 is fabricated using a material such as N+ doped polysilicon/Silicide/N+ polysilicon. To form the gate dielectric strips 102 and the conductive strips 104/106, for example, a thermal oxidation is conducted to form an oxide layer (not shown) and then a chemical vapor deposition with in-situ doping is carried out to form a doped polysilicon layer (not shown), and silicide and another N+ polysilicon are consequently formed. Thereafter, photolithographic and etching processes are carried out to pattern the first conduction layer.

Figure 1B:
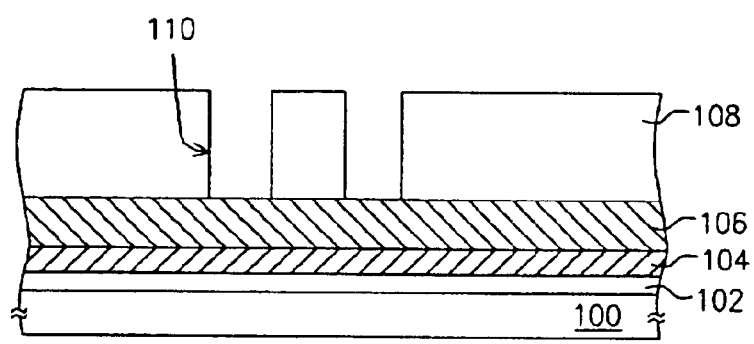

As shown in FIG. 1B, a dielectric layer 108 is formed over the substrate 100 and the conductive strips 106. The dielectric layer 108 is a silicon oxide layer formed, for example, by chemical vapor deposition. Thereafter, a plurality of coding openings 110 is formed in the dielectric layer 108. The coding openings expose the desired decoding locations. To form the coding openings 110, for example, a photoresist layer (not shown) over the dielectric layer 108 is patterned using a coding mask (not shown). Next, an etching process is conducted to remove a portion of the dielectric layer 108 so that the conductive layer 106 at the bottom of the code openings 110 is exposed.

Figure 1C:
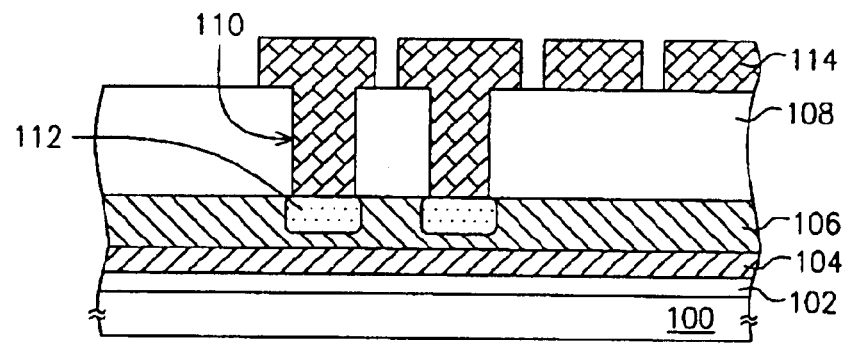

As shown in FIG. 1C, wells 112 are formed in the conductive strips 106 exposed by the code openings 110. To form the wells 112, an ion implantation is carried out using the patterned photoresist layer so that a doped region is formed in the conductive strips 106. The patterned photoresist layer is removed and then an annealing process is conducted to form the wells 112. The wells 112 have a second doping state such as a P-doped type that differs from the first conductive layer doping type.

Thereafter, a conductive layer 114 patterned into a plurality of longitudinal strips is formed over the dielectric layer 108 to serve as bit lines. The conductive strips 114 are perpendicular to the conductive strips 106. Furthermore, the conductive strips 114 fill the coding openings 110 so that the conductive strips 114 and corresponding wells 112 are electrically connected. The conductive strips 114 are fabricated using a metallic material such as aluminum, tungsten and copper. The conductive strips 114 are formed, for example, by conducting a physical vapor deposition or a chemical vapor deposition to fill the coding openings 110 and then carrying out photolithographic and etching processes to form a plurality of conductive strips over the dielectric layer 108.

According to the steps from FIGS. 1A to 1C, an array of memory cells each consisting of a diode (the memory cell within the wells 112) is formed. In the subsequent steps from FIGS. 1D to 1F, another array of diode memory cells is stacked over the original memory cell array.

Figure 1D:
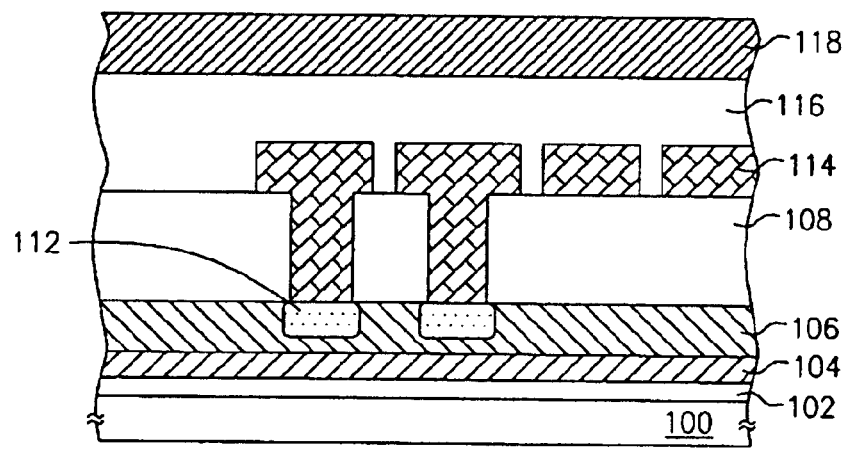

As shown in FIG. 1D, a dielectric layer 116 is formed over the dielectric layer 108 and the conductive strips 114. The dielectric layer 116 is a layer that separates the structure into two different memory cell array. Typically, the dielectric layer 116 is a silicon dioxide layer formed, for example, by conducting a chemical vapor deposition. Thereafter, a conductive layer 118 is formed over the dielectric layer 116 and then patterned to form a plurality of conductive strips 118. The conductive strips 118 are N+ doped polysilicon/silicide/N+ doped polysilicon formed, for example, by conducting chemical vapor deposition with in-situ doping of ions to form a doped polysilicon layer (not shown) and then silicide and polysilicon are formed. Next, photolithographic and etching processes are conducted to pattern the conductive layer into a plurality of conductive strips 118. The conductive strips 118 have a doping state identical to the first doping state such as a N+-doped state.

Figure 1E:
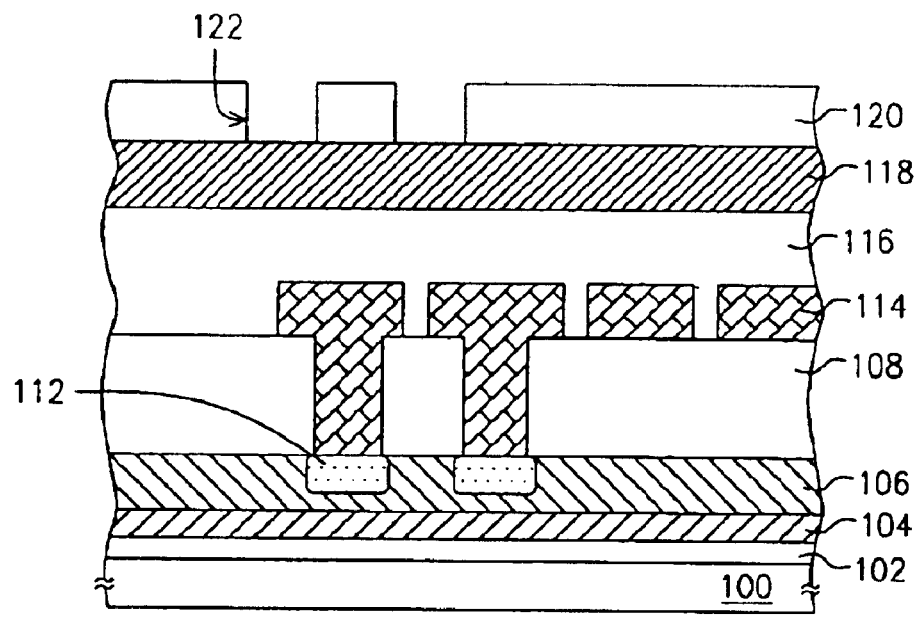

As shown in FIG. 1E, a dielectric layer 120 is formed over the dielectric layer 116 and the conductive strips 118. The dielectric layer 120 is a silicon oxide layer formed, for example, by chemical vapor deposition. Thereafter, coding openings 122 that expose the desired coding regions are formed in the dielectric layer 120. The coding openings 122 are formed, for example, by forming a patterned photoresist layer (not shown) over the dielectric layer using a coding mask (not shown). Thereafter, an etching process is conducted to remove a portion of the dielectric layer 120 using the patterned photoresist layer as a mask so that the conductive strips 118 are exposed at the bottom of the coding openings 122.

Figure 1F:
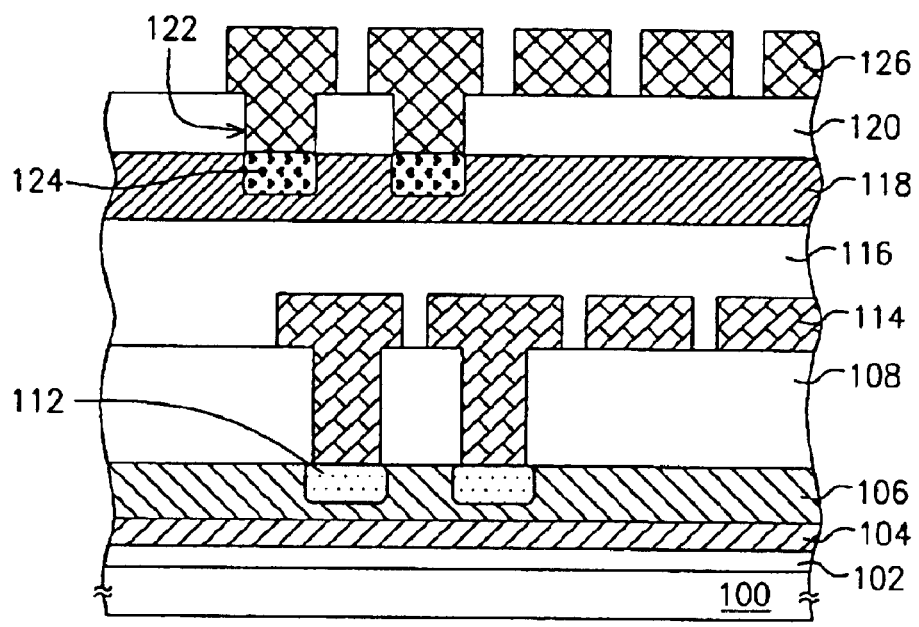

As shown in FIG. 1F, wells 124 are formed in the conductive strips 118 at the bottom of the coding openings 122. To form the wells 124, an ion implantation is carried out using the patterned photoresist layer so that a doped region is formed in the conductive strips 118. The patterned photoresist layer is removed and then an annealing process is conducted to form the wells 124. The wells 124 have a second doping state such as a P-doped state.

Thereafter, a conductive layer 126 patterned into a plurality of longitudinal strips is formed over the dielectric layer 120 to serve as bit lines. The conductive strips 126 are perpendicular to the conductive strips 118. Furthermore, the conductive strips 126 fill the coding openings 122 so that the conductive strips 126 and corresponding wells 124 are electrically connected. The conductive strips 126 are fabricated using a metallic material such as aluminum, tungsten and copper. The conductive strips 126 are formed, for example, by conducting a physical vapor deposition or a chemical vapor deposition to fill the coding openings 122 and then carrying out photolithographic and etching processes to form a plurality of conductive strips over the dielectric layer 120.

After carrying out the steps shown in FIGS. 1A to 1F, two layers stacked diode memory cell array inside a mask ROM are formed. Since subsequent steps for completing the fabrication of a mask ROM should be familiar to those skill in the art, detailed description is omitted here.

FIG. 1F is a cross-sectional view of a mask ROM structure according to this invention. Using just one memory cell array structure in FIG. 1F as an illustration, the mask ROM comprises of a substrate 100, a plurality of gate dielectric 102, a plurality of stacked layers, a plurality of wells 112, a dielectric layer 108 and a plurality of conductive strips 114.

The gate dielectric 102 are positioned over the substrate 100. The stacked layers are formed over the respective gate dielectric 102. Each stacked layer includes a first conductive layer 104 and a second conductive layer 106. The first conductive layer 104 and the second conductive layer together serve as a word line for the memory device. The second conductive layer 106 has a first doping state such as a N+-doped state.

The dielectric layer 108 is positioned over the substrate 100 and the stacked layer. The dielectric layer 108 has a plurality of coding openings 110 that exposes the second conductive layer 106. The wells 112 are located in the second conductive layer 106 at the bottom of the coding openings 110. The wells 112 have a second doping state such as a P-doped state different from the first doping state. The conductive strips 114 are positioned over the dielectric layer 108 and inside the coding openings 110 to serve as bit lines for the memory device. The conductive strips 114 run in a direction perpendicular to the stacked layer. The conductive strips 114 are electrically connected to their respective wells 112 so that the well 112 joining the second conductive layer (the word line) 106 and the conductive strip (the bit line) 114 constitute a diode memory cell.

The aforementioned mask ROM structure contains only a single memory cell array. To form a mask ROM with two memory cell arrays, the mask ROM further includes a dielectric layer 116, a plurality of conductive strips 118, a plurality of wells 124, a dielectric layer 120 and a plurality of conductive strips 126.

The dielectric layer 116 is positioned between the dielectric layer 108 and the conductive strips 114 to serve as a layer for isolating the two memory cell arrays. The conductive strips 118 are positioned over the dielectric layer 116 to serve as word lines for the memory device. The conductive strips 118 have a first doping state such as a N-doped state. The dielectric layer 120 is positioned over the dielectric layer 116 and the conductive strips 118. The dielectric layer 120 has a plurality of coding openings 122 that exposes the conductive strips 118.

The conductive strips 126 are positioned over the dielectric layer 120 and inside the coding openings 122 to serve as bit lines for the memory device. The conductive strips 126 runs in a direction perpendicular to the conductive strips 118. The conductive strips 126 are electrically connected to their respective wells 124 so that the wells 124 joining the conductive strip (the word line) 118 and the conductive strip (the bit line) 126 constitute a diode memory cell. A mask ROM structure having two layers of diode memory cell arrays is shown in FIG. 1F.

Figure 2:
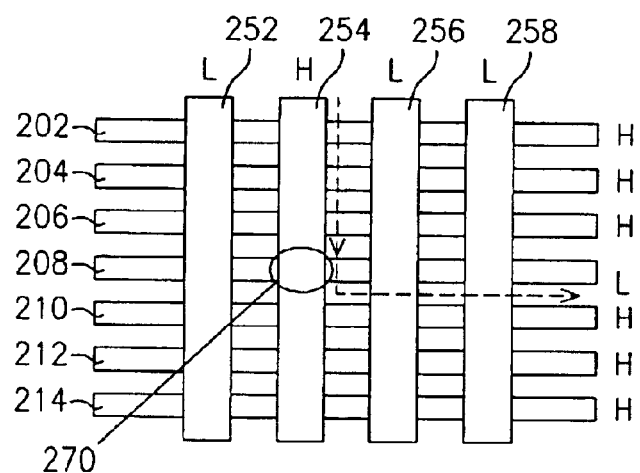
FIG. 2 is a diagram showing the process of decoding a mask ROM fabricated according to this invention.

FIG. 2 is a diagram showing the process of decoding a mask ROM fabricated according to this invention. As shown in FIG. 2, labels 202 to 214 represent word lines and labels 252 to 258 represent bit lines. The word lines and the bit lines are on different planes set at a different height level. Furthermore, wells (not shown) where a decoding implant is demanded are located on some of the word lines at the cross-section between the word lines and the bit lines and that the bit line and the well are electrically connected to form a diode. In other cross-junction between the word line and the bit line without a decoding implant, the word lines and the bit lines are disconnected. To decode a location such as 270 in FIG. 2, a high voltage is applied to the corresponding bit line 254 while a low voltage is applied to the other bit lines 252, 256 and 258. In the meantime, a low voltage is applied to the word line 208 while a high voltage is applied to the other word lines 202, 204, 206, 210, 212 and 214. With this decode settings, current will flow in the arrow direction as shown in FIG. 2, passing through the cell location 270 instead of the surrounding cells, during a decoding operation.

In the aforementioned embodiment, the purpose of forming the conductive layer 104 (polycide) is to render the process of invention compatible with a conventional mask ROM process for the need to form peripheral circuit regions. If peripheral circuit fabrication can disregarded, the conductive layer 106 (N+ doped polysilicon) that serves as word line for the memory cell array can be directly fabricated without forming the conductive layer 104.

Furthermore, in the aforementioned embodiment, a mask ROM structure having two stacked memory cell arrays is illustrated. However, this invention has no restriction on the number of memory cell arrays in a mask ROM. In fact, additional stacks of memory cell arrays may be created through repeating the steps as indicated in FIGS. 1D to 1F.

In summary, the cells in the memory cell array of the mask ROM according to this invention are diodes. Hence, the memory cell array may stack on top of each other to form a three-dimensional structure. Consequently, size of each memory cell can be reduced and the level of integration of the memory device can be increased.

Furthermore, the decoding regions (the diodes) with implant ions are regarded as a logic state "1" and those decoding regions without implanted ions are regarded as a logic state "0". Thus, determining the logic value ("1" or "0") in the memory cell is much clearer. In other words, the decoding window is larger.

In addition, the bit lines may be fabricated using a metallic material. Hence, compared with a bit line formed by substrate doping, the bit lines have a lower resistance and a higher operating speed.

Moreover, there is no need to fabricate transistors. Hence, processing demands are simpler and less stringent. Ultimately, the fabrication of the mask ROM in this invention is very simplified.

It will be apparent to those skilled in the art that various modifications and variations can be made to the structure of the present invention without departing from the scope of the invention. In view of the foregoing, it is intended that the present invention cover modifications and variations of this invention provided they fall within the scope of the following claims and their equivalents.

What is claimed is:

1. A method of fabricating a mask read-only-memory, comprising the steps of:
   providing a substrate;
   sequentially forming gate dielectric and a plurality of first conductive strips over the substrate;
   forming a first dielectric layer over the first conductive strips;
   patterning the first dielectric layer to form a plurality of first coding openings, wherein each first coding opening exposes the first conductive strip;
   forming a first well in the first conductive strip at the bottom of each first coding opening; and
   forming a plurality of second conductive strips over the first dielectric layer and inside the first coding openings, wherein the second conductive strips connect electrically with their respective first wells to from a first memory cell array.

2. The method of claim 1, wherein material constituting the first conductive strips includes doped polysilicon.

3. The method of claim 1, wherein the first conductive strips have a doping state (N+ type) that differs from the doping state of the first wells (P+ type).

4. The method of claim 1, wherein material constituting the second conductive strips is selected from a group consisting of aluminum, tungsten, copper and doped polysilicon.

5. The method of claim 1, wherein the first conductive strips are aligned in a direction perpendicular to the second conductive strips.

6. The method of claim 1, wherein step of forming the mask ROM may further include forming a word line between each gate oxide layer and each first conductive strip.

7. The method of claim 1, wherein after the step of forming the second conductive strips over the first dielectric layer and inside the first coding openings, may further include the steps of:
   (a) forming a second dielectric layer over the first dielectric layer and the second conductive strips;
   (b) forming a plurality of third conductive strips over the second dielectric layer;
   (c) forming a third dielectric layer over the second dielectric layer and the third conductive strips;
   (d) patterning the third dielectric layer to form a plurality of second coding openings, wherein each second coding opening exposes the third conductive strip;
   (e) forming a second well in the third conductive strip at the bottom of each second coding opening; and
   (f) forming a plurality of fourth conductive strips over the third dielectric layer and inside the coding openings, wherein the fourth conductive strips connect electrically with the respective second wells to form a second memory cell array.

8. The method of claim 7, wherein material constituting the third conductive strips includes doped polysilicon.

9. The method of claim 7, wherein the third conductive strips have a doping state that differs from the doping state of the second wells.

10. The method of claim 7, wherein material constituting the fourth conductive strips is selected from a group consisting of aluminum, tungsten, copper and doped polysilicon.

11. The method of claim 7, wherein the third conductive strips are aligned in a direction perpendicular to the fourth conductive strips.

12. The method of claim 7, after performing the steps from (a) to (f), further includes repeating the steps from (a) to (f) to form a plurality of second memory cell arrays over the second memory cell array.

13. A mask read-only-memory structure, comprising:
   a substrate;
   gate dielectric over the substrate;
   a plurality of first conductive strips over the gate dielectric layer;
   a first dielectric layer over the substrate and the first conductive strips, wherein the first dielectric layer has a plurality of first coding openings and that each first coding openings expose the first conductive strip;
   a plurality of first wells each located inside the first conductive strip at the bottom of the first coding opening; and
   a plurality of second conductive strips over the first dielectric layer and inside the first coding openings, wherein the second conductive strips connect electrically with their respective first wells, and that the gate dielectric layer, the first conductive strips, the first dielectric layer, the first wells, the second conductive strips together form a first memory cell array.

14. The structure of claim 13, wherein material constituting the first conductive strips includes N+ doped polysilicon/Silicide/N+ doped polysilicon.

15. The structure of claim 13, wherein the first conductive strips have a doping state that differs from the doping state of the first wells.

16. The structure of claim 13, wherein material constituting the second conductive strips is selected from a group consisting of aluminum, tungsten, copper and doped polysilicon.

17. The structure of claim 13, wherein the first conductive strips are aligned in a direction perpendicular to the second conductive strips.

18. The structure of claim 13, wherein the mask ROM structure may further include a word line between each gate oxide layer and each first conductive strip.

19. The structure of claim 13, wherein the mask ROM structure may further include:
- a second dielectric layer over the first dielectric layer and the second conductive strips;
- a plurality of third conductive strips over the second dielectric layer;
- a third dielectric layer over the second dielectric layer and the third conductive strips, wherein the third dielectric layer has a plurality of second coding openings and that each second coding opening exposes the third conductive strip;
- a second well in the third conductive strip at the bottom of each second coding opening; and
- a plurality of fourth conductive strips over the third dielectric layer and inside the coding openings, wherein the fourth conductive strips connect electrically with the respective second wells such that the second dielectric layer, the third conductive strips, the third dielectric layer, the second wells, the fourth conductive strips together form a second memory cell array.

20. The structure of claim 19, wherein material constituting the third conductive strips includes doped polysilicon.

21. The structure of claim 19, wherein the third conductive strips have a doping state (N+ type) that differs from the doping state of the second wells (P+ type).

22. The structure of claim 19, wherein material constituting the fourth conductive strips is selected from a group consisting of aluminum, tungsten, copper and doped polysilicon.

23. The structure of claim 19, wherein the third conductive strips are aligned in a direction perpendicular to the fourth conductive strips.

24. The structure of claim 19, wherein the mask ROM structure may further include a plurality of second memory cell arrays stacked over the second memory cell array.

25. A method of decoding a mask read-only-memory (ROM), wherein the mask ROM at least includes a plurality of word lines, a plurality of wells over the respective word lines such that the word lines have a doping state (N+ type) that differs from the wells (P+ type) and a plurality of bit lines such that the bit lines are aligned in a direction perpendicular to the word lines and that the bit lines and the word lines are on separate planes, and some of the junctions between the bit line and the word line are electrically connected to corresponding well, the decoding method includes:
- applying a first voltage to the bit line corresponding to a decoding location while applying a second voltage to all other bit lines such that the first voltage is greater than the second voltage, and at the same time, applying a third voltage to the word line corresponding to the decoding location while applying a fourth voltage to all the other word lines such that the fourth voltage is larger than the third voltage.

* * * * *